United States Patent
Vaninetti

Patent Number: 5,206,604
Date of Patent: Apr. 27, 1993

[54] BROADBAND HIGH POWER AMPLIFIER

[75] Inventor: Roy A. Vaninetti, Palm Bay, Fla.

[73] Assignee: Harris Corporation, Melbourne, Fla.

[21] Appl. No.: 811,168

[22] Filed: Dec. 20, 1991

[51] Int. Cl.⁵ .............................................. H03F 3/68
[52] U.S. Cl. ................................. 330/124 R; 330/295
[58] Field of Search ............... 330/124 D, 124 R, 126, 330/286, 295, 53

[56] References Cited

U.S. PATENT DOCUMENTS

| | | | |
|---|---|---|---|
| 4,375,622 | 3/1983 | Hollingsworth et al. | 333/126 |
| 4,647,869 | 3/1987 | Kaneko et al. | 330/295 X |
| 4,688,259 | 8/1987 | Edridge | 455/12 |
| 4,724,400 | 2/1988 | Luettgenau | 330/295 |
| 4,931,747 | 6/1990 | Hom | 330/295 X |
| 4,970,479 | 11/1990 | Landt et al. | 333/101 |
| 5,032,804 | 7/1991 | Hollingsworth | 333/132 |

Primary Examiner—Steven Mottola
Attorney, Agent, or Firm—Evenson, Wands, Edwards, Lenahan & McKeown

[57] ABSTRACT

A broadband high power amplifier for multifrequency signal applications comprises an N-way power combiner that is arranged to combine a plurality of multi-frequency input signals and provide a combined (complex) signal at its output. The output of the N-way combiner is amplified in a preamplifier stage and supplied therefrom to an M-way power divider. The M-way power divider has a plurality of M output ports from which M subdivided versions of the combined (complex) output signal from the preamplifier are derived. Each of these effectively identical subdivided signals is coupled to a respective one of a plurality of M signal amplifier stages that drive the radial power combiner. Each amplifier stage is a relatively low to moderate gain amplifier stage, so that its amplitude and phase characteristics may be matched with those of the others of the M amplifier stages. Since the phase and amplitude characteristics of the amplifier stages that drive the radial power combiner are matched with one another, the M stage driver is effectively self-isolating, making it unnecessary to use band-limiting isolator components to protect the outputs of the respective driver amplifier stages feeding the radial power combiner.

3 Claims, 1 Drawing Sheet

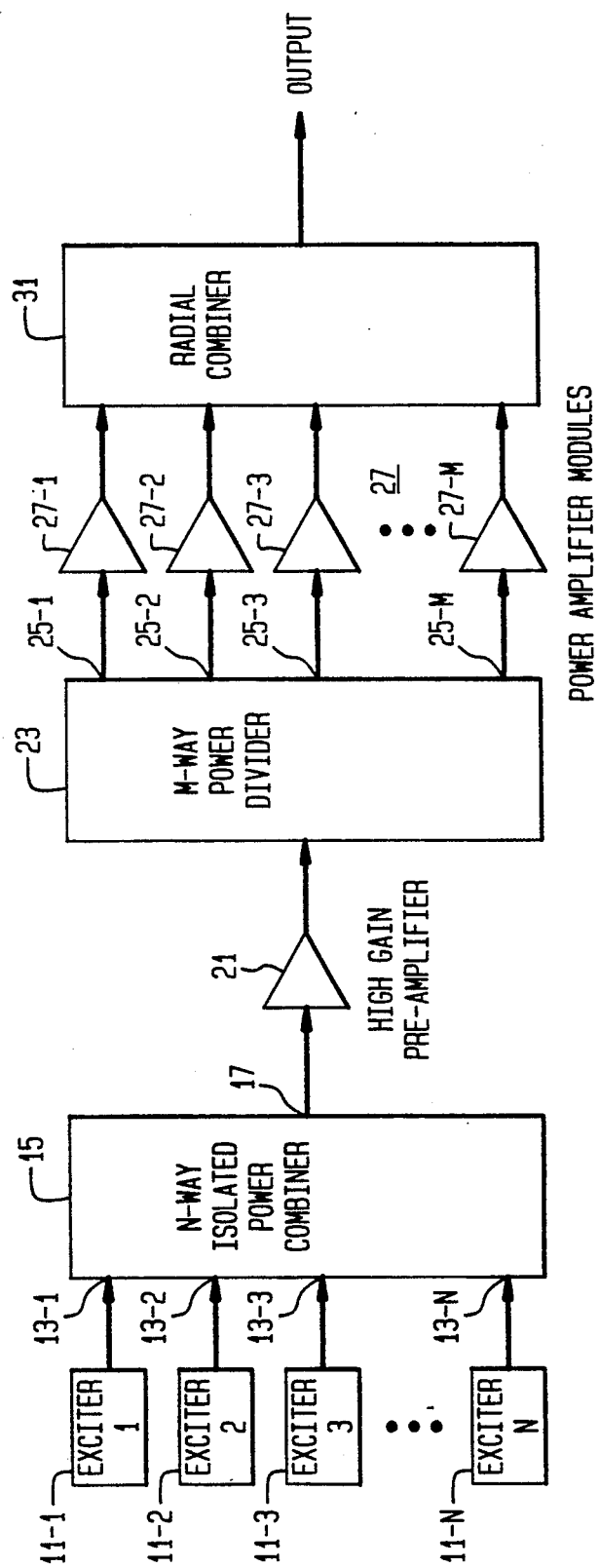

BROADBAND HIGH POWER AMPLIFIER

The present invention was conceived and reduced to practice in conjunction with the performance of a U.S. Government Contract, specifically USAF Contract No. F33657-88-C-2110.

FIELD OF THE INVENTION

The present invention relates in general to (RF) communication systems, and is particularly directed to a broadband high power amplifier architecture, which combines and amplifies multifrequency signals using a radial power combiner without the need for isolation components in the signal feed paths to the input ports of the radial combiner.

BACKGROUND OF THE INVENTION

Current technology designs of high power multifrequency amplifiers for radio frequency communication applications typically use high gain amplifiers to amplify respectively different frequency signals that are to be combined and fed to an associated antenna unit. Because of the substantial amplitude and phase mismatch of the high gain amplifiers which feed the power combiner (typically, a radial power combiner), it is necessary to insert a respective isolator between the output of each high gain amplifier and a respective input port of the combiner, which undesirably limits the bandwidth of the amplifier. Moreover, each input port of the system is dedicated to a particular frequency signal, so that the amplifier is not readily adaptable to feed or signal input changes.

SUMMARY OF THE INVENTION

In accordance with the present invention, the above-enumerated drawbacks of prior art high power amplifier architectures are obviated by a new and improved broadband high power amplifier, having a plurality of input ports that need not be dedicated to preselected frequencies, so that the system offers considerably enhanced versatility over conventional designs with respect to port connections and the ability to vary the choice of input signals. In addition, by virtue of a self-isolation configuration, no isolator elements are required in the amplifier signal path connections to the respective input ports of the radial power combiner, so that the bandwidth is not limited by such components, as in the prior art.

Rather than employ (inherently mismatched) high gain amplifiers to amplify respectively different frequency signals that are to be combined and fed to an associated antenna unit, which mandates the insertion of band-limiting isolators between the output of each high gain amplifier and a respective input port of a (radial) power combiner, the broadband amplifier architecture of the present invention couples a plurality of moderate gain signal amplifier stages, having matched amplitude and phase characteristics, between a signal input stage and the input ports of a radial power combiner.

For wideband multi-signal applications, the signal input stage comprises an N-way power combiner that is arranged to combine a plurality of multi-frequency input signals and provide a combined (complex) signal at its output. The output of the N-way combiner is amplified in a preamplifier stage and supplied therefrom to an M-way power divider. The M-way power divider has a plurality of M output ports from which M subdivided versions of the combined (complex) output signal from the preamplifier are derived. Each of these effectively identical subdivided signals is coupled to a respective one of a plurality of M signal amplifier stages that driver the radial power combiner. Each amplifier stage is a relatively moderate gain amplifier stage, so that its amplitude and phase characteristics may be matched with those of the others of the M amplifier stages. Since the phase and amplitude characteristics of the amplifier stages that drive the radial power combiner are matched with one another, the M stage driver is effectively self-isolating, making it unnecessary to use band-limiting isolator components to protect the outputs of the respective driver amplifier stages feeding the radial power combiner.

BRIEF DESCRIPTION OF THE DRAWINGS

The single FIG. is a diagrammatic illustration of a broadband high power amplifier in accordance with the present invention.

DETAILED DESCRIPTION

Before describing in detail the particular improved broadband high power amplifier in accordance with the present invention, it should be observed that the present invention resides primarily in a novel structural combination of conventional signal processing circuits and components and not in the particular detailed configurations thereof. Accordingly, the structure, control and arrangement of these conventional circuits and components have been illustrated in the drawings by a readily understandable block diagram which shows only those specific details that are pertinent to the present invention, so as not to obscure the disclosure with structural details which will be readily apparent to those skilled in the art having the benefit of the description herein. Thus, the block diagram illustration of the FIG. does not necessarily represent the mechanical structural arrangement of the exemplary system, but is primarily intended to illustrate the major structural components of the system in a convenient functional grouping, whereby the present invention may be more readily understood.

Referring now to the single FIG., a broadband high power amplifier in accordance with the present invention is shown is diagrammatically shown for its use with a plurality of multifrequency inputs 11-1...11-N, identified in the FIG. as a plurality of exciters 1-N. It should be observed, however, that the present invention is not limited to such a multi-signal application. Its amplification of a plurality of diverse frequency signals is to illustrate its broadband use. In an exemplary environment, exciters 1-N may represent respective sources for jamming or EMI test purposes, for example over a range of 20-100 MHz.

For the illustrated wideband multi-signal application, exciters 1-N are coupled to respective inputs 13-1 13-N of an N-way power combiner 15. Combiner 15 performs a summation of a 1/N fraction of the output of each of exciters 1-N and provides a combined, multi-frequency (complex) signal at its output. This combined signal is then amplified in a high gain (e.g. 50-60dB) preamplifier stage 21 and supplied therefrom to an M-way power divider 23. M-way power divider 23 has a plurality of M output ports 25-1–25-M from which M subdivided versions of the preamplified combined (complex) output signal from preamplifier stage 21 are derived. Each output port 25-i of power divider 23 is essentially the same signal output by high gain amplifier 21, but at an amplitude that is 1/Mth of that at the input to the power divider and the phase of each of which is the same. Each of these effectively identical subdivided signals is coupled to a respective one of a plurality of M signal amplifiers 27-1-27-M of a driver stage 27 that feeds a radial power combiner 31. Radial power combiner may be of the type described in an article by S. Foti et al, entitled "60-way radial power combiner uses no isolators," in Microwaves & RF, Jul., 1984, pp 96, 97, 100, 118, and in an article by D.Stones, entitled: "A UHF 16-Way Power Combiner Designed by Synthesis Techniques," Microwave Journal, Jun. 1989, pp 117-120.

In accordance with the present invention, each amplifier stage is a relatively low or moderate gain amplifier (e.g. a 350W driver), which permits its amplitude and phase characteristics to be effectively matched (e.g. within 0.5dB and $++/-10°$) with those of the others of the M amplifier stages. Since the subdivided signals supplied to the M amplifiers of driver stage 27 from M-way power divider 23 are coherent with one another, and since the phase and amplitude characteristics of the respective amplifiers of driver stage 27 that feed radial power combiner 31 are matched with one another, M stage driver 27 is effectively self-isolating, making it unnecessary to insert band-limiting isolator components at the outputs of amplifiers 27-i to protect the outputs of the respective driver amplifier stages feeding the radial power combiner. The number of stages feeding radial power combiner 31 will depend upon the power output desired. For example a twelve, 350W amplifier stage feeding twelve associated ports of combiner 31 will produce a 4.2kW output. Since the phase and amplitude characteristics of all of the low gain feed amplifiers are matched, the system is effectively self-isolating, so that the number of stages capable of feeding radial combiner is not limited, thereby permitting both high power and broadband operation to be realized. The class of amplifiers employed for high gain preamplifier stage 21 and the amplifiers of M stage driver 27 is not limited to a particular type and may correspond to class A, AB and C amplifiers, for example.

As will be appreciated from the foregoing description, the present invention offers a new and improved broadband high power amplifier capable of combining and amplifying a plurality of input signals that need not be dedicated to preselected frequencies, so that the system offers considerably enhanced versatility over conventional designs with respect to port connections and the ability to vary the choice of input signals. In addition, by virtue of a self-isolation configuration, no isolator elements are required in the amplifier signal path connections to the respective input ports of the radial power combiner, so that the system enjoys wideband operation.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A broadband high power amplifier comprising:

a plurality of N input ports to which a plurality of signals of differing frequencies are applied;

an N-way power combiner coupled to combine the plurality of signals applied to said input ports and provide a combined output signal at an output port thereof;

a preamplifier coupled to amplify the combined output signal provided by said N-way power combiner;

an M-way power divider having an input coupled to receive the amplified combined output signal from said preamplifier and providing said input port and a plurality of M output ports from which M subdivided combined output signals are derived;

a plurality of signal amplifier stages having matched amplitude and phase characteristics, respectively coupled to the plurality of output ports of said power divider; and a radial power combiner having a plurality of inputs respectively coupled to outputs of said plurality of signal amplifier stages, and having an output from which an amplified signal is derived.

2. A method of combining and amplifying a plurality of signals of differing frequencies comprising the steps of:

(a) coupling said plurality of signals of differing frequencies to N input ports of an N-way power combiner, which is operative to combine the plurality of signals applied to said input ports and provide a combined output signal at an output port thereof;

(b) coupling said combined output signal to an M-way power divider which is operative to provide a plurality of M subdivided combined output signals;

(c) coupling said plurality of M subdivided combined output signals to a plurality of signal amplifier stages having matched amplitude and phase characteristics; and (d) coupling a radial power combiner having a plurality of inputs to outputs of said plurality of signal amplifier stages, and deriving from an output thereof an amplified signal.

3. A method according to claim 2, wherein step (b) comprises coupling a high gain amplifier stage between said input port and said M-way power divider.

* * * * *